(12) United States Patent
Stemmer et al.

(10) Patent No.: US 10,379,185 B2
(45) Date of Patent: Aug. 13, 2019

(54) METHOD AND APPARATUS FOR ACQUIRING MAGNETIC RESONANCE DATA

(71) Applicant: Siemens Aktiengesellschaft, Munich (DE)

(72) Inventors: Alto Stemmer, Erlangen (DE); Cong Zhao, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 885 days.

(21) Appl. No.: 14/813,678

(22) Filed: Jul. 30, 2015

(65) Prior Publication Data
US 2016/0033605 A1  Feb. 4, 2016

(30) Foreign Application Priority Data
Jul. 31, 2014  (CN) .......................... 2014 1 0374509

(51) Int. Cl.
| | | |
|---|---|---|
| *G01R 33/48* | (2006.01) | |
| *G01R 33/561* | (2006.01) | |
| *G01R 33/565* | (2006.01) | |
| *G01R 33/56* | (2006.01) | |

(52) U.S. Cl.
CPC ..... *G01R 33/4828* (2013.01); *G01R 33/5617* (2013.01); *G01R 33/56509* (2013.01); *G01R 33/5607* (2013.01)

(58) Field of Classification Search
CPC ............ G01R 33/4828; G01R 33/5617; G01R 33/56509; G01R 33/5607
See application file for complete search history.

(56) References Cited

U.S. PATENT DOCUMENTS

| | | |
|---|---|---|
| 5,909,119 A | 6/1999 | Zhang et al. |
| 6,147,492 A | 11/2000 | Zhang et al. |
| 6,853,188 B2 | 2/2005 | Feinberg et al. |
| 7,863,895 B2 | 1/2011 | Ma |
| 9,285,447 B2 * | 3/2016 | Zhao .................. G01R 33/4828 |

(Continued)

FOREIGN PATENT DOCUMENTS

WO  WO-2011/080693 A1  7/2011

OTHER PUBLICATIONS

Ma et. al.: "Method for Efficient Fast Spin Echo Dixon Imaging", Magnetic Resonance in Medicine, vol. 48, pp. 1021-1027; (2002,).

(Continued)

*Primary Examiner* — Dixomara Vargas
(74) *Attorney, Agent, or Firm* — Schiff Hardin LLP

(57) ABSTRACT

In a method and apparatus for acquiring magnetic resonance (MR) data from a subject, excitation pulses and at least two refocusing pulses are applied to the subject in an MR scanner, and the MR scanner is operated to activate gradients in a readout direction that cause at least two gradient echoes to be formed between the at least two successive refocusing pulses, with a temporal distance between the at least two gradient echoes that produces a predetermined phase shift between a signal acquired from a first nuclei in the subject and a signal acquired from a second nuclei in the subject at times of the respective gradient echoes, and that include readout gradients associated respectively with a first and a last gradient echo, among said at least two gradient echoes, the readout gradients being asymmetrical.

17 Claims, 9 Drawing Sheets

(56) References Cited

U.S. PATENT DOCUMENTS

| | | |
|---|---|---|
| 2003/0011367 A1 | 1/2003 | Asano et al. |
| 2004/0263166 A1 | 12/2004 | Kluge |
| 2005/0017719 A1 | 1/2005 | Heubes |
| 2010/0259260 A1 | 10/2010 | Lee et al. |
| 2013/0214783 A1* | 8/2013 | Zhao ............... G01R 33/4828 324/309 |
| 2013/0249548 A1 | 9/2013 | Stemmer |
| 2017/0363699 A1* | 12/2017 | Ookawa ............ G01R 33/4828 |

OTHER PUBLICATIONS

Ma et. al.: "A fast spin echo triple echo Dixon (fTED) technique for efficient T2-weighted water and.fat imaging", Proc. Intl. Soc. Mag. Reson. Med., vol. 14, pp. 3025; (2006).

Hardy et. al.: "Separation of Fat and Water in Fast pin-Echo MR Imaging with the Three-Point Dixon Technique", in: Journal of Magnetic Resonance Imaging, vol. 5, pp. 181-185; (1995).

Ma et. al.: "Fast Spin-Echo Triple-Echo Dixon (fTED) Technique for Efficient T2-Weighted Water and Fat Imaging", in: Magnetic Resonance in Medicine, vol: 58, pp. 103-109; (2007).

Szumowski et. al.: "Double-Echo Three-Point-Dixon Method for Fat Suppression MRI", Magnetic Resonance in Medicine vol. 34, pp. 120-124; (1995).

Weng , et. al.: "Water Fat Separation with TSE BLADE Based on Three Points Dixon Technique", ISMRM, (2010).

Zhang et. al.: "Separation of Water and Fat MR Images in a Single Scan at .35 T Using "Sandwich" Echoes", in: Journal of Magnetic Resonance Imaging,, vol. 6, pp. 909-9017; (1996).

\* cited by examiner

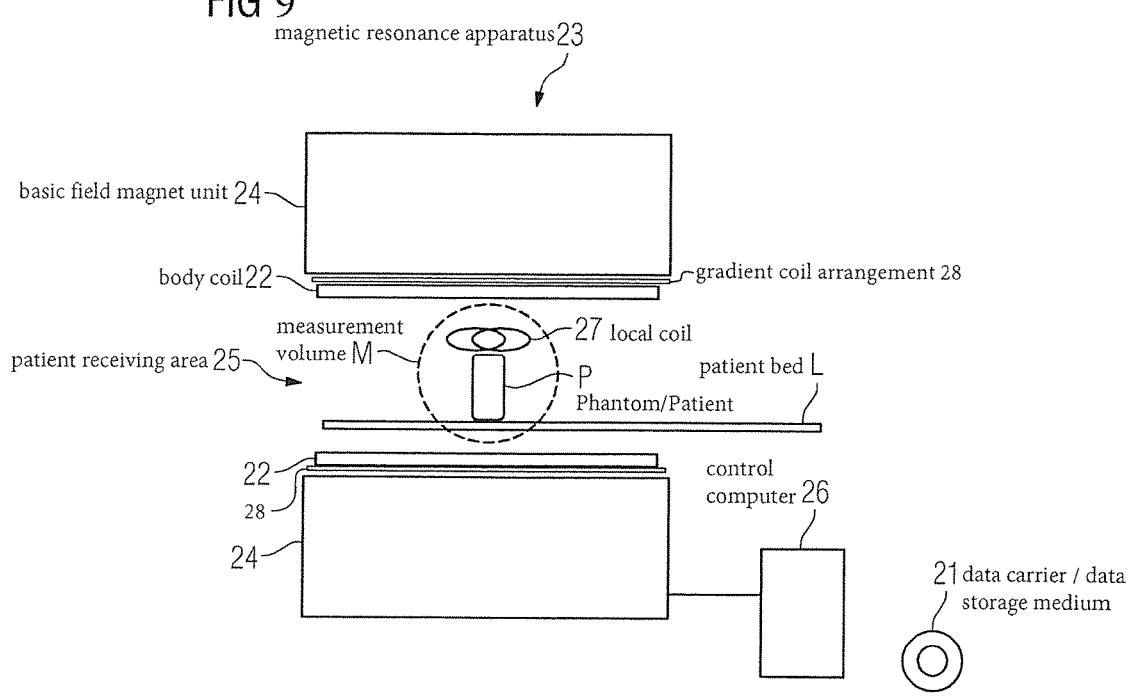

METHOD AND APPARATUS FOR ACQUIRING MAGNETIC RESONANCE DATA

BACKGROUND OF THE INVENTION

Field of the Invention

The present invention relates to a method for acquiring magnetic resonance data and an apparatus for implementing such a method.

Description of the Prior Art

Turbo Spin Echo (TSE) is a most important sequence for T2 weighted imaging in clinical application. The primary advantage compared to conventional spin echo technique is the reduced scan time. A TSE echo train consists of an excitation pulse followed by a train of refocusing pulses. The echo formed after each refocusing pulse is individually encoded so that multiple k-space lines can be sampled after the excitation pulse. TSE is one of many acronyms used for the technique. The most important others are fast spin echo (FSE), rapid acquisition with relaxation enhancement (RARE) and fast acquisition interleaved spin echo (FAISE).

Fat (lipid) signal appears bright in T2 weighted TSE imaging. The bright fat signal can obscure detection of lesions. A number of techniques are known to suppress the fat signal. The resonance frequency of protons bound to lipid molecules is approximately 3.3-3.5 parts per million (ppm) lower than the resonance frequency of protons bound to water. This fact can be utilized to suppress the bright fat signal. The most important clinical technique is still to use a frequency selective saturation or inversion pulses before each TSE excitation pulse. A saturation pulse excites the spins bound to lipids and leaves the spins bound to water unaffected. The fat signal is subsequently dephased with a spoiler gradient. The TSE echo train is executed immediately after the preparation pulse, i.e. before a significant number of fat spins being realigned with the static field due to T1 relaxation. Alternatively, the preparation module can use frequency selective inversion pulse. A certain time interval after the inversion pulse the lipid magnetization approaches zero since half of the spins have returned to the equilibrium state (again due to T1 relaxation). At this point in time the excitation pulse of the TSE echo train is executed. The disadvantage of selective lipid suppression or inversion is that these techniques rely on a homogeneous B0 field which often cannot be established in the entire imaging volume despite of shimming.

An alternative to spectral saturation or inversion is the use of a Dixon technique. The Dixon technique allows separating the fat and water component of the tissue into separate images. The Dixon technique can be used for fat suppression (diagnosis based on the water only images) or for fat water quantification were the local fat content of tissue is determined.

Inputs to the Dixon reconstruction are multiple complex images with different (and known) phase shift between water and fat component. The number of the input images needed and the required phase shift of these images depend on the particular Dixon technique. The classical 2-point Dixon technique, for example, requires two images, a first so called opposed phase image with phase shift of 180° between water and fat component and a second so called in-phase image with zero phase shift. Modern Dixon variants often require more than two input images and the desired phase shift increment between adjacent input images is often smaller than π (180°), e.g. 2π/3 in a 3-point Dixon technique.

One specific group of TSE Dixon sequences is important in the context of this invention. This group replaces the readout gradient in the middle between two adjacent refocusing pulses of a conventional TSE sequence by a train of readout gradients. The primarily advantage of this group is its motion insensitivity and comparable short scan time, as will be discussed later.

A gradient echo is formed whenever the net gradient moment is zero. The sequence is designed such that a gradient echo is formed during each readout gradient. This particular point is called the center of the readout (gradient). For all known TSE Dixon sequences which belong to the specified group the center of the readout coincides with the point of gravity of the readout gradient. If the center of a particular readout gradient lies half-way between the two adjacent refocusing pulses (i.e. coincides with the spin-echo) the phase shift between water and fat will be zero. The phase shift of another image depends on the temporal distance between the center of the corresponding readout gradient and the spin-echo point. The reason is that an off-center spin accumulates an additional phase which grows linear in time and is directly proportional to the off-center frequency. The different resonance frequency of the water and fat component therefore translates in a phase difference of the acquired images which depends (for a given B0 field strength) only on the temporal distance of the center of the corresponding readout and the spin-echo-point.

As stated before most Dixon reconstruction techniques require a particular specified phase difference $\Delta\phi$ between water and fat and hence (for a given field strength) a particular temporal distance between the center of the readout and the spin-echo point. Within the specified group of TSE Dixon sequence the duration of a readout gradient is therefore limited by the temporal distance between the centers of readout gradients which belong to images with adjacent phase shift. Some Dixon techniques can cope with a range of phase differences between a minimum phase difference $\Delta\phi_{min}$ and maximum $\Delta\phi_{max}$. In this case the maximum phase difference $\Delta\phi_{max}$ limits the duration of the readout gradient. By setting the specified phase difference $\Delta\phi$ equal to $\Delta\phi_{max}$ the flexible $\Delta\phi$ range can therefore be reduced to the fixed $\Delta\phi$ case. The principle problem stays the same and a differentiation between the two cases is omitted in what follows.

The maximum resolution in readout direction is directly proportional to the $0^{th}$ moment of the readout gradient. The maximum gradient strength and the maximum usable slew rate of the gradient system are limited and therefore also the resolution in readout direction. Further, since the sign of the gradient waveform in readout direction needs to be inverted at least once between adjacent readout gradients the maximum achievable gradient moment is much less than temporal distance between adjacent readout gradients times the maximum gradient strength, in general.

Common to most of the previous published TSE Dixon sequences is that corresponding k-space data of different echoes (i.e. with different phase shift between water and fat) are acquired after different excitation pulses.

This makes these TSE based Dixon techniques prone to motion that occur between excitations. TR times in FSE are comparatively long on the same time scale than the typical time intervals associated with physiological motion (due to breathing, heart beating or peristaltic). Further, B0 fluctuations (as a result of physiological motion or heating) between excitations leads to additional phase accumulation which cannot be distinguished from phase differences due to the fat-water frequency shift per se. Breath-holding is the most common technique to reduce breathing related artifacts. However, acquiring different echoes after different excitation pulses also increases approximately the minimum scan time by a factor n in an n-point Dixon technique. The reason is that the number of excitations and hence the number of TR intervals is increased by a factor n compared to a conventional non-Dixon scan. The resulting scan times exceeds the breath-hold capacities of most patients, at least for reasonable resolution. The following publications belong to this slow and motion sensitive group:

[1] Peter A. Hardy et al. "Separation of Fat and Water in Fast pin-Echo MR Imaging with the Three-Point Dixon Technique". JMRI 1995; 5:181-185
[2] Jerzy Szumowski et al. "Double-Echo Three-Point-Dixon Method for Fat Suppression MRI". MRM 34:120-124 (1995)
[3] Jingfei Ma et al. "Method for Efficient Fast Spin Echo Dixon Imaging". Magnetic Resonance in Medicine 48:1021-1027 (2002)
[4] Weng Dehe et al. "Water Fat Separation with TSE BLADE Based on Three Points Dixon Technique". ISMRM 2010, 2925
[5] Weiguo Zhang et al. "Separation of Water and Fat MR Images in a Single Scan at 0.35 T Using "Sandwich" Echoes". JMRI 1996; 6:909-917
[6] Jingfei Ma et al. "Fast Spin-Echo Triple-Echo Dixon (fTED) Technique for Efficient T2-Weighted Water and Fat Imaging". Magnetic Resonance in Medicine 58:103-109 (2007)
[7] Jingfei Ma et al. "A fast spin echo triple echo Dixon (fTED) technique for efficient T2-weighted water and fat imaging". Proc. Intl. Soc. Mag. Reson. Med. 14 (2006) 3025

Reference 3 contains a TSE Dixon sequence with asymmetric readout. Opposite to the present invention it belongs to the slow, motion sensitive group which acquires different echoes after different excitations. Also the motivation is different. The intention of the asymmetric readout is not an increased resolution in readout direction but to avoid that the echo spacing is increased and that the number of slices that can be acquired in a given imaging time is reduced compared to a conventional TSE sequence. The increase in echo spacing and the reduced number of slices are problems of earlier TSE Dixon techniques. The efficiency statement ("number of slices in a given imaging time") is only correct if the time for a single input image (echo) is considered. i.e. the TSE Dixon technique of Reference 3 needs n times the acquisition time of conventional scan for the n input images (echoes) of an n-point Dixon technique.

Acquiring different echoes (with different phase shift between water and fat) of a particular k-space line in a train of gradient echoes after a particular refocusing pulse greatly reduces the motion sensitivity without increasing the minimum scan time (measured in number of excitations (TR intervals)). The idea was first published by Zhang et al. for a conventional spin echo sequence on a 0.35 T scanner. In reference 5, Zhang et al. suggest to repeat the train of gradient echoes (termed "sandwich") after each refocusing pulse in a TSE-like sequence. One discussed option was to acquire different k-space lines after different refocusing pulses to reduce scan times.

FIG. 1 shows a conventional TSE-Dixon sequence used by Zhang. In comparison with the well-known CPMG (Carr-Purcell-Meiboom-Gill) TSE sequence the single readout gradient is replaced by a train of three readout gradients with alternative sign. The center of the second readout gradient (with negative sign) coincides with the spin echo. The fat-water shift of the corresponding image is therefore zero. The center of the two other readout gradients deviates from the spin echo point by a time interval $\Delta TE$ chosen such that the phase shift between water and fat is $-180°$ and $+1800$, respectively. The gradient in the readout direction between the 90° excitation pulse and the first refocusing gradient serves as prephasing gradient of the first readout gradient. The sign of this gradient and the sign of the first readout gradient after each refocusing pulse are the same since the refocusing pulse negates the phase of all spins. The second half of the first readout gradient (after the gradient echo) serves as prephasing gradient of the second readout gradient. Similar the second half of the second readout gradient serves as prephasing gradient of the third readout gradient. The second half of the third readout gradient has the same moment as the prephasing gradient between excitation pulse and first refocusing pulse. It therefore implicitly restores the dephasing of the spins so that it effectively unchanged by the combined action of the refocusing pulse and the three following readout gradients. The phase encoding axis is not shown in the FIG. 1. Phase encoding is performed before the first readout gradient and after the preceding refocusing pulse and is therefore identical for all three echo signals. Since a particular Fourier-encoding line of all images used for the Dixon reconstruction are acquired in the same echo spacing immediately after each other problems with patient motion are minimized. The dephasing due to the phase encoding gradient is undone after the third readout gradient and before the next refocusing pulse by a phase-encoding rephrasing gradient with same absolute moment but opposite sign.

Since the time $\Delta TE$ between adjacent gradient echoes decreases with increasing field strength (e.g. for a 180° phase shift, $\Delta TE=2.30$ ms at 1.5 T and $\Delta TE=1.15$ ms at 3 T) the technique can be applied with a spatial resolutions required for clinical imaging only at low fields. Even an extraordinary strong gradient hardware cannot solve this problem for a human scanner since the switching between readout gradients of opposite sign would induce nerve stimulations.

SUMMARY OF THE INVENTION

An object of the present invention is to provide a TSE Dixon sequence which acquires two images needed for a two point Dixon reconstruction with a train of the readout gradients but in increased resolution in readout direction compared to the corresponding TSE Dixon sequence known from the state of the art. The invented Dixon sequence hence shares the motion insensitivity and short acquisition time with the TSE Dixon sequences of the specified group known in the state of the art and additionally increases the resolution in readout direction compared to the corresponding known sequence.

Since the temporal distance needed to achieve a particular phase difference between readout centers decreases with field strength B0, the invention is particular important for high field systems with field strength of 3 T and beyond.

This object of the present invention is achieved by a method for acquiring magnetic resonance (MR) data from a subject situated in an MR scanner that includes the following steps:

a) operating the MR scanner to apply an excitation pulse to the subject, b) operating the MR scanner to apply at least two refocusing pulses to the subject, c) operating the MR scanner to apply gradients to the subject that cause at least two gradient echoes to be formed between the at least two successive refocusing pulses, with a temporal distance between the at least two gradient echoes that produces predetermined phase shift between a signal being acquired from a first nuclei in the subject and a signal being acquired from a second nuclei in the subject at times of the respective gradient echoes, with the readout gradients associated respectively with a first gradient echo, among said at least two gradient echoes, and a last gradient echo, among said of the at least two gradient echoes, being asymmetrical.

The present invention is to provide a CPMG TSE 2-point Dixon sequence with increased spatial resolution. The invented CPMG TSE Dixon sequence forms at least two gradient echoes between each pair of successive refocusing pulses with the aid of a train of gradients. The temporal distance $\Delta T1$ between the two gradient echoes from the spin-echo point (in the middle between the two refocusing pulses) is chosen such that a particular desired phase shift $\theta 1$ and $\theta 2$ between signals emerging from fat and water protons is realized at the time of the first and second gradient echo, respectively. For a particular field strength of the B0 field the temporal distance $\Delta T=|T2-T1|$ between the two gradient echoes is directly proportional to $\Delta\theta=|\theta 2-\theta 1|$. The maximum readout moment of the second part (after the echo) of the first readout gradient M01+ and the maximum readout moment M02− of the second readout gradient is therefore limited for a given maximum amplitude and slew rate of the gradient system and a desired gradient waveform (e.g. monopolar, bipolar, with/without ramp sampling). The invented TSE Dixon sequence increases the total readout moment of both readout gradients beyond 2*M01+ and 2*M02−, respectively by prolonging the first readout gradient and readout time before the first echo and the second readout gradient and readout time past the second echo. The k-space of the two images is sampled asymmetrically. The total distance traversed in k-space during each readout is extended (compared to a symmetric readout) and hence the resolution in readout direction. The unsampled areas in k-space are either zero filled before the Fourier Transform or substituted by a Partial Fourier reconstruction. The CPMG condition of the TSE sequence is maintained by a suitable adaption of the readout prephasing gradient either between excitation pulse and first refocusing pulse or between each refocusing pulse and the first readout gradient after this refocusing pulse. Further, alternatively, to maintain the CPMG condition, a readout rephrasing or "flyback" gradient is added between the end of the last readout gradient and before the next refocusing pulse.

Further, the present invention is to provide a CPMG TSE n-point Dixon sequence with shortened echo spacing between successive refocusing pulses to reduce T2 decay along the echo train, for example and thereby sharpen the images. Again the temporal position of each gradient echo relative to the spin echo point is chosen to realize a particular desired phase shift between signal emerging from fat and water protons. The invented sequence shortens the duration of the first and/or last readout gradient of each train of readout gradient (relative to a duration required for a symmetric readout) by acquiring the first and last echo asymmetrically. The readout prephasing gradient between the excitation pulse and the first refocusing pulse is adapted to maintain the CPMG condition.

According to an embodiment in the present invention, the at least two gradient echoes are formed such that the readout gradients reading out the gradient echoes are asymmetrical in such a way that a duration of the first part of a readout gradient from the gradient echo point to the end of the readout gradient towards the other gradient is shorter than a duration of the second part of the readout gradient from the gradient echo point to the other end of the readout gradient.

According to an embodiment in the present invention, the k-space data which could not be acquired due to the asymmetry of the readout gradients are either filled up with Zeros or reconstructed via a Partial Fourier Reconstruction technique, to yield a full k-space data set.

According to an embodiment in the present invention, the at least two readout gradients reading out the formed gradient echoes have the same polarity.

The present invention is advantageously designed wherein a prephasing gradient is added between the two readout gradients such that the moment acquired by the preceding readout gradient after the first gradient echo and the moment acquired by the following readout gradient up to the point of the second gradient echo is compensated by the added prephasing gradient.

According to an embodiment, a readout prephasing gradient is applied between the excitation pulse and the following refocusing pulse or between each refocusing pulse and the first readout gradient after this refocusing pulse such that the CPMG (Carr-Purcell-Meiboom-Gill) condition is satisfied.

According to an embodiment, a readout rephasing gradient is applied between a readout gradient and the following refocusing pulse or between a refocusing pulse and the following readout gradient such that the CPMG (Carr-Purcell-Meiboom-Gill) condition is satisfied.

According to the method for acquiring magnetic resonance data in the present invention, the echo spacing between the two successive refocusing pulses is minimized.

Preferably, according to an embodiment in the present invention, the first nuclei are protons of a first chemical and the second nuclei are protons of a second chemical. Preferably, the first chemical is water, and the second chemical is fat.

The object of the present invention also is achieved by an apparatus for acquiring magnetic resonance (MR) data from a subject having an MR scanner comprising a basic field magnet that generates a constant magnetic field, an RF transmitter, a gradient coil arrangement, and an RF receiver;

a control computer configured to operate the MR scanner to cause the RF coil to radiate excitation pulses and refocusing pulses into a subject situated in the MR scanner;

said control computer being configured to operate said gradient coil arrangement to activate a gradient in a readout direction that causes gradient echoes to be produced by nuclei in the subject excited by said excitation pulses;

said control computer being configured to operate said gradient coil arrangement to activate said gradient to produce at least two gradient echoes between at least two successive refocusing pulses, with a temporal distance between said at least two gradient echoes that produces a predetermined phase shift between a signal originating from first nuclei in the subject and a signal originating from second nuclei in the subject, at times of the respective gradient echoes, and to activate readout gradients associated with a first gradient echo, among said at least two gradient echoes, and a last gradient echo, among said at least two gradient echoes, the readout gradients being asymmetrical;

said control computer being configured to operate said RF receiver to receive MR signals from said gradient echoes; and said control computer being configured to make the received data signals available in electronic form as a data file at an output of said control computer.

In an embodiment, the control computer controls the second coil to form the gradient echoes with the asymmetrical readout gradient in such a way that a duration of the first part of a readout gradient from the spin echo point of the gradient echo to the end of the readout gradient towards the other gradient echo formed is shorter than or equal to a duration of the second part of the readout gradient from the spin echo point to the other end of the readout gradient.

In another embodiment, the control computer controls the second coil such that the at least two readout gradients reading out the formed gradient echoes have the same polarity.

Preferably, the control computer controls the second coil to add a prephasing gradient between the two readout gradients such that the moment acquired by the preceding readout gradient after the first gradient echo and the moment acquired by the following readout gradient up to the point of the second gradient echo is compensated by the added prephasing gradient.

Preferably, the control computer controls the second coil to apply a readout prephasing gradient between the excitation pulse and the following refocusing pulse or between each refocusing pulse and the first readout gradient after this refocusing pulse such that the CPMG (Carr-Purcell-Meiboom-Gill) condition is satisfied.

In another embodiment in the present invention, the control computer controls the second coil to apply a readout rephasing gradient between a readout gradient and the following refocusing pulse or between a refocusing pulse and the following readout gradient such that the CPMG (Carr-Purcell-Meiboom-Gill) condition is satisfied.

BRIEF DESCRIPTION OF THE DRAWINGS

FIG. 9 is a schematic illustration of a magnetic resonance apparatus according to the invention.

DESCRIPTION OF THE PREFERRED EMBODIMENTS

Figure 1:
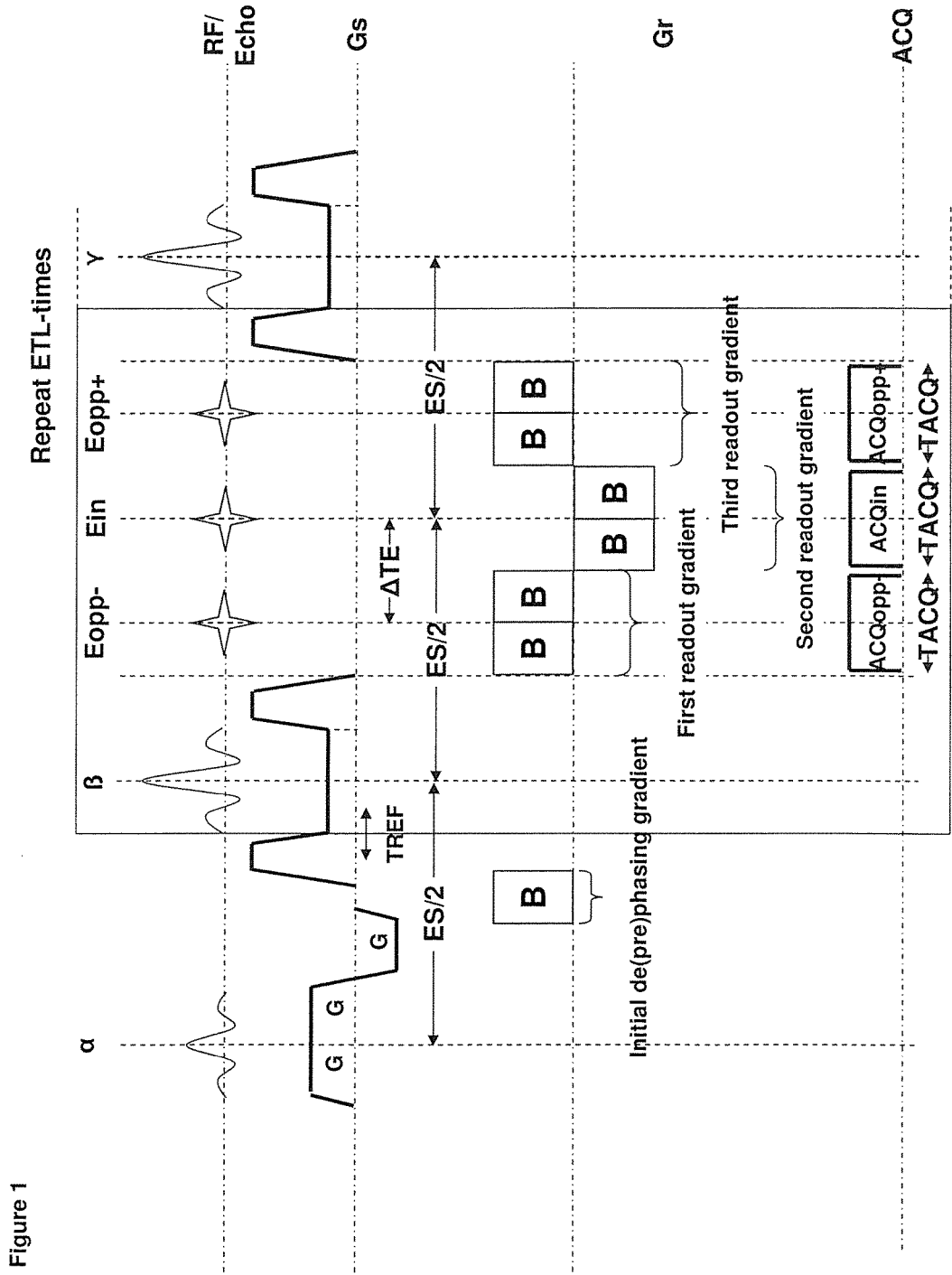
FIG. 1 illustrates a schematic diagram of a prior art having a TSE Dixon sequence with symmetric readout.
Figure 2:
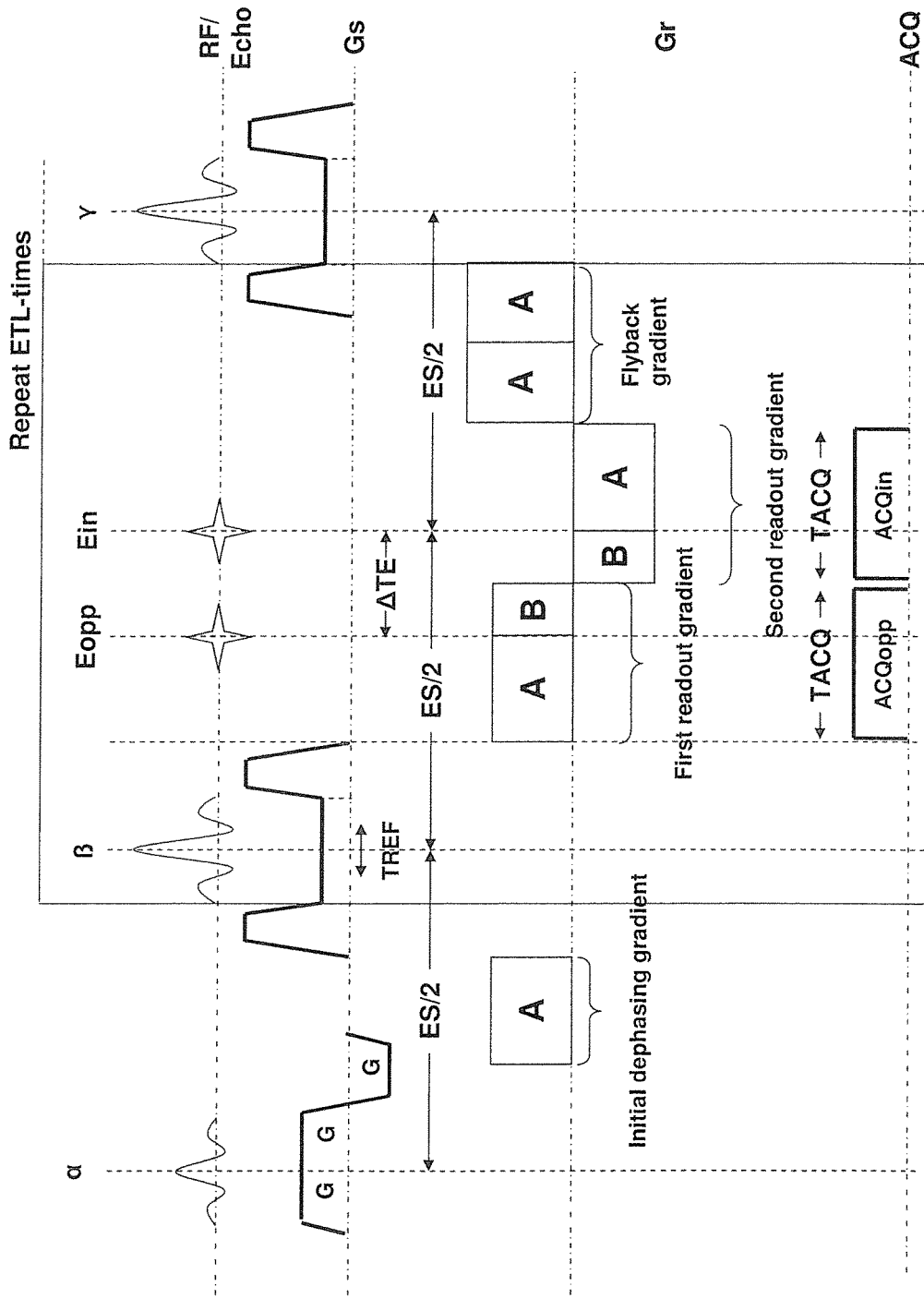
FIG. 2 illustrates a schematic diagram of a first embodiment in the present invention having a sequence with asymmetric readout.

FIG. 2 shows a modified sequence for a 2-point Dixon technique which allows an increased readout moment and hence an increased resolution for a given temporal spacing between the two echoes compared to the sequence of FIG. 1. In the drawn example and the description, it is assumed that the desired phase shift between water and fat of the two acquired images is again 00 and 1800, respectively. This makes the comparison with the sequence of FIG. 1 easier. However, any other phase shift could also be realized via an adaptation of readout gradient scheme. For the same reason, for an easier comparison, it is assumed that the readout bandwidth (and hence the amplitude of the readout gradients) is the same in FIGS. 1 and 2.

Figure 4:
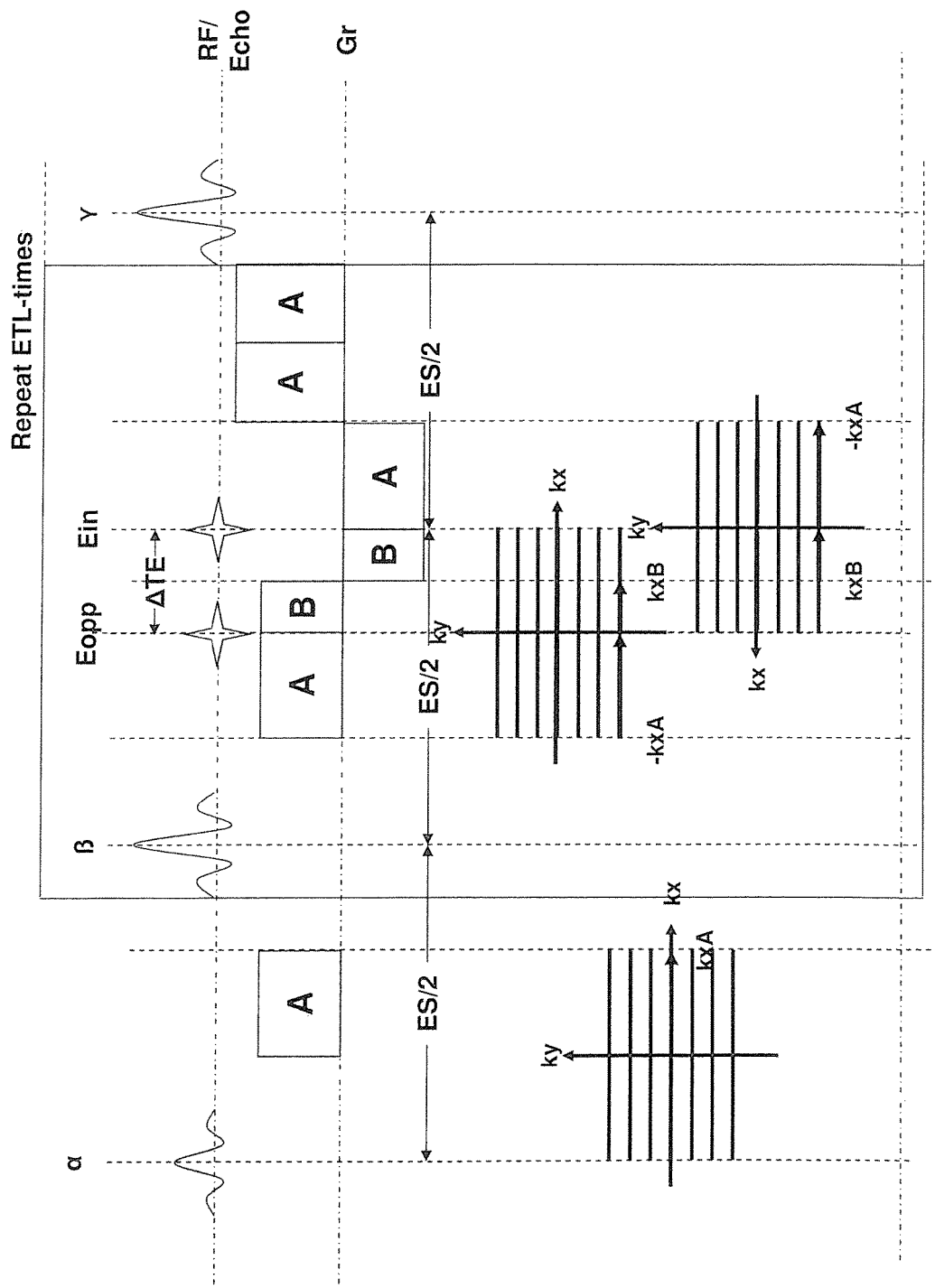
FIG. 4 illustrates a schematic diagram having K-space trajectory of the sequence of FIG. 2.

Compared to the state of the art sequence shown in FIG. 1, the first modification in FIG. 2 to the state of the art sequence is that only two gradient echoes per spin-echo (refocusing pulse) are readout. This is sufficient for a 2-point Dixon technique. The second modification is that the duration of the first half of the first readout gradient is prolonged so that the total moment of this sub-gradient is A instead of B with A>B. Similarly, the second part of the second readout (after the second gradient echo) gradient is also prolonged. The second part of the first readout gradient and the first part of the second readout gradient are unchanged (moment B) since these sub-gradients are limited by the fixed time shift ΔTE. Further the temporal position of the first and second gradient echo is unchanged. In the drawn example this is achieved by an adaption of the readout prephasing gradient. The total moment is increased to B. To maintain the CPMG condition, the third readout gradient is replaced by a readout rephrasing or flyback gradient with total moment 2A. This gradient serves for that the net effect on the phase of the combined action of a particular refocusing pulse and the following three gradients in readout direction (two readout gradients plus flyback gradient) is zero. This is mandatory. Otherwise, the signal of spins that were in the transversal plane between a particular pair of refocusing pulses would destructively interfere with the signal of spins that was stored in the longitudinal direction between the particular pair of refocusing pulses in later readout intervals. The prolonged duration of the first part of the first readout gradient allows to sample more points before the echo than after the echo. k-space is therefore sampled asymmetrically. This is illustrated in FIG. 4. The first readout gradient samples k-space asymmetrically from −kxA to kxB, with |kxAB|>|kxB|. Similar the second readout gradient samples k-space from +kxB to −kxA. The k-space positions between +kxB and +kxA are not acquired. They are either zero filled before image reconstruction or substituted during the reconstruction process by what is known as a Partial Fourier reconstruction (e.g. "Margosian algorithm" or iterative method "Projection onto Convex sets"). Partial Fourier reconstruction is based on the fact that the Fourier transforms of a real image or object is Hermitian, meaning that the real part is symmetric and the imaginary part is antisymmetric with respect to the k-space center. Therefore only one half of k-space needs to be sampled, theoretically and the other half can be substituted with the complex conjugate. However, in practice a small amount of the other half is also needed to correct undesired phase shifts resulting from frequency offsets, hardware group delays, eddy current and so forth.

It is noted that the sequence of FIG. 1 samples k-space symmetrically from −kxB to +kxB. Partial Fourier techniques cannot be applied.

FIG. 4 further shows that in the k-space view the readout prephasing gradient drives the magnetization from the center of k-space (kx=0,ky=0) to the point (+kxA, 0). The refocusing pulse negates the phase accumulated during the readout prephasing gradient. In the k-space view this means a jump from (+kxA, 0) before the refocusing pulse to (-kxA, 0) after the refocusing pulse. Between the refocusing pulse and the first readout gradient the phase encoding gradient brings the magnetization from (-kxA,0) to (-kxA, n*Δky) where Δky is the phase encoding delta moment (line spacing) and n is the particular line number to be sampled during the next readout interval. In the drawn example n=-3 for the first readout interval and n assumes value between -3 and +3. In actual imaging the total number of ky lines is usually much higher than 7 (in the range of 64 and 1024) but not all lines are necessarily sampled. After the end of the second readout gradient the readout flyback gradient brings the kx component of the magnetization back to +kxA and the phase encoding rephrasing gradient (not shown) the ky component back to zero.

Figure 3:
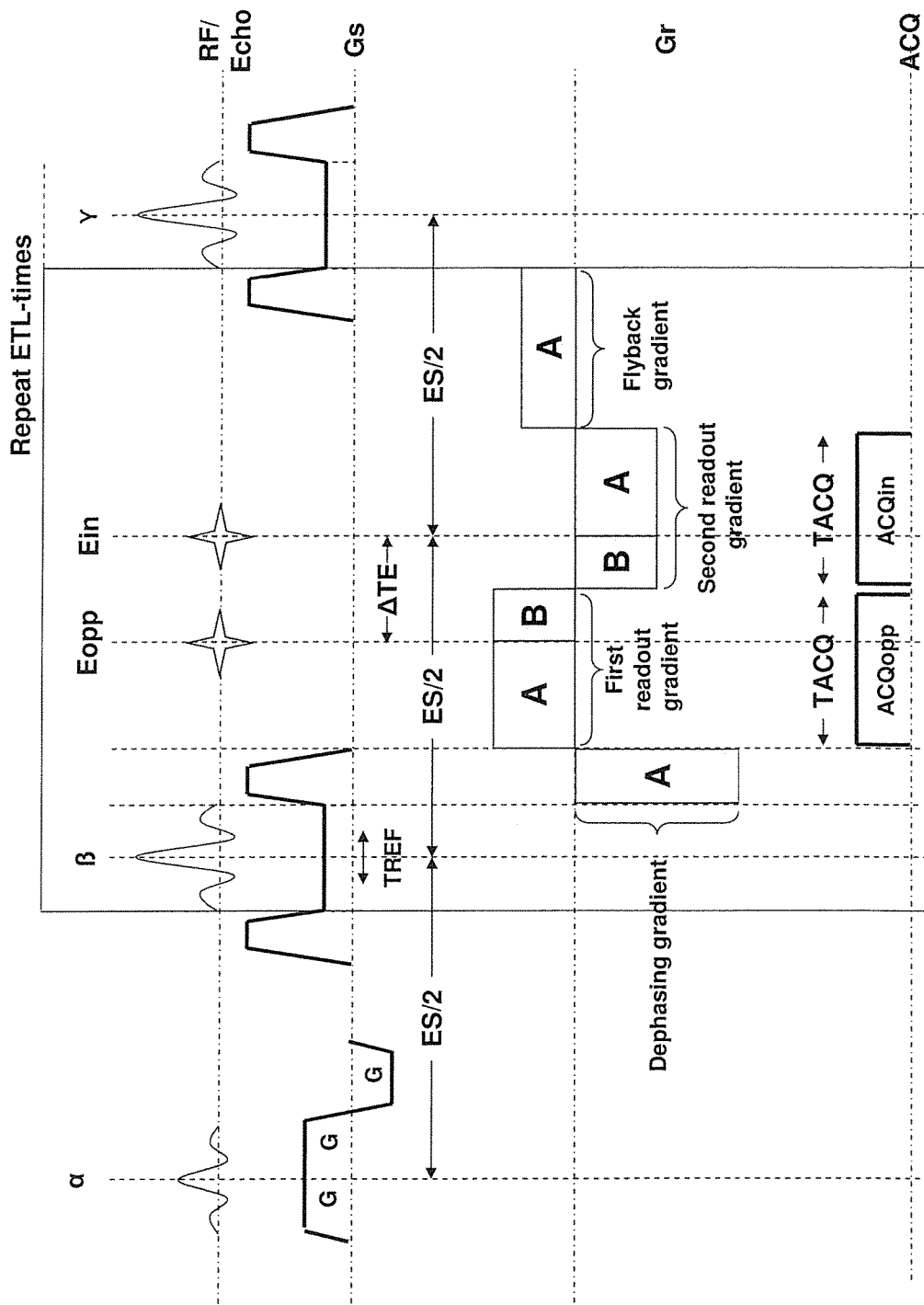
FIG. 3 illustrates a schematic diagram of a second embodiment in the present invention having a sequence with asymmetric readout.

FIG. 3 shows a second embodiment of the modified sequence. This sequence is also intended for a two point Dixon technique and also allows an increased readout moment and hence an increased resolution for a given temporal spacing between the two echoes compared to the sequence of FIG. 1. The difference to the Sequence of FIG. 2 is the absence of the prephasing gradient between excitation pulse and the first refocusing gradient. Instead the prephasing is repeated for every readout interval. It is preferably performed simultaneously with the FID Crusher and phase encoding gradient (not drawn) immediately after the refocusing pulse. The rephasing (or flyback gradient) is also modified. It has now the same absolute moment as the prephasing gradient and opposite sign so that the net moment of all gradient performed along the readout direction between two successive refocusing pulses is zero.

Figure 5:
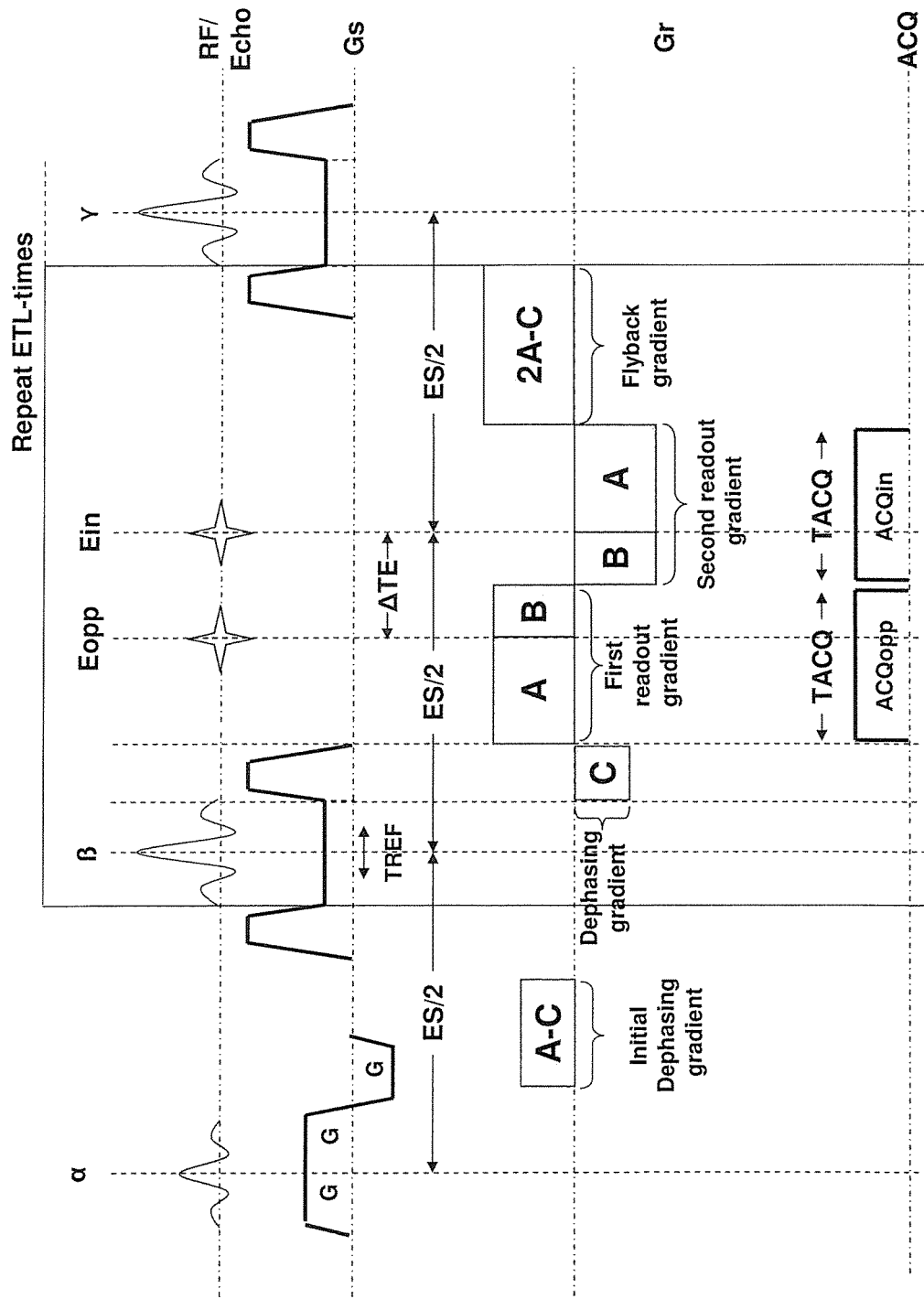
FIG. 5 illustrates a schematic diagram according to a third embodiment in the present invention having asymmetric readout.

FIG. 5 illustrates a schematic diagram according to a third embodiment in the present invention having asymmetric readout. FIG. 2 and FIG. 3 are special versions of the most general design shown in FIG. 5. In the most general embodiment part of the readout prephasing is done once between the excitation pulse and the first refocusing pulse (similar to FIG. 2) and the remaining readout prephasing is repeated for every readout interval (similar to FIG. 3). The sign of the initial prephasing gradient is again equal to the sign of the first readout gradient and the sign of the repeated dephasing gradient is opposite to the sign of the first readout gradient. The moment of the flyback gradient is chosen such that the net effect on the phase of the combined action of a particular refocusing pulse and the following four gradients in readout direction (repeated dephasing gradient, two readout gradients plus flyback gradient) is zero. Hence if the moment of the repeated dephasing gradient is -C, the moment of the flyback gradient is 2A-C.

In TSE imaging, the shortest possible echo spacing is preferred, in general. For a given number of readout intervals (refocusing pulses), a short echo spacing reduces the length of the entire echo train and hence the T2 decay along the echo train. The T2 decay along the echo train leads to the so called T2 blurring of the images in phase encoding direction. Since the time between the point of the excitation pulse and the center of the first refocusing pulse is half the echo spacing (time between the center of two successive refocusing pulses), the minimum echo spacing is limited by the accumulated duration of the gradients that need to performed between the end of the excitation pulse and the start of the first refocusing pulse and is limited by the gradients that need to be performed between two successive refocusing pulse. Choosing among the three alternative designs shown in FIGS. 2, 3 and 5, one prefers the design which allows the realization of shortest echo spacing for the required imaging parameters.

Figure 6:
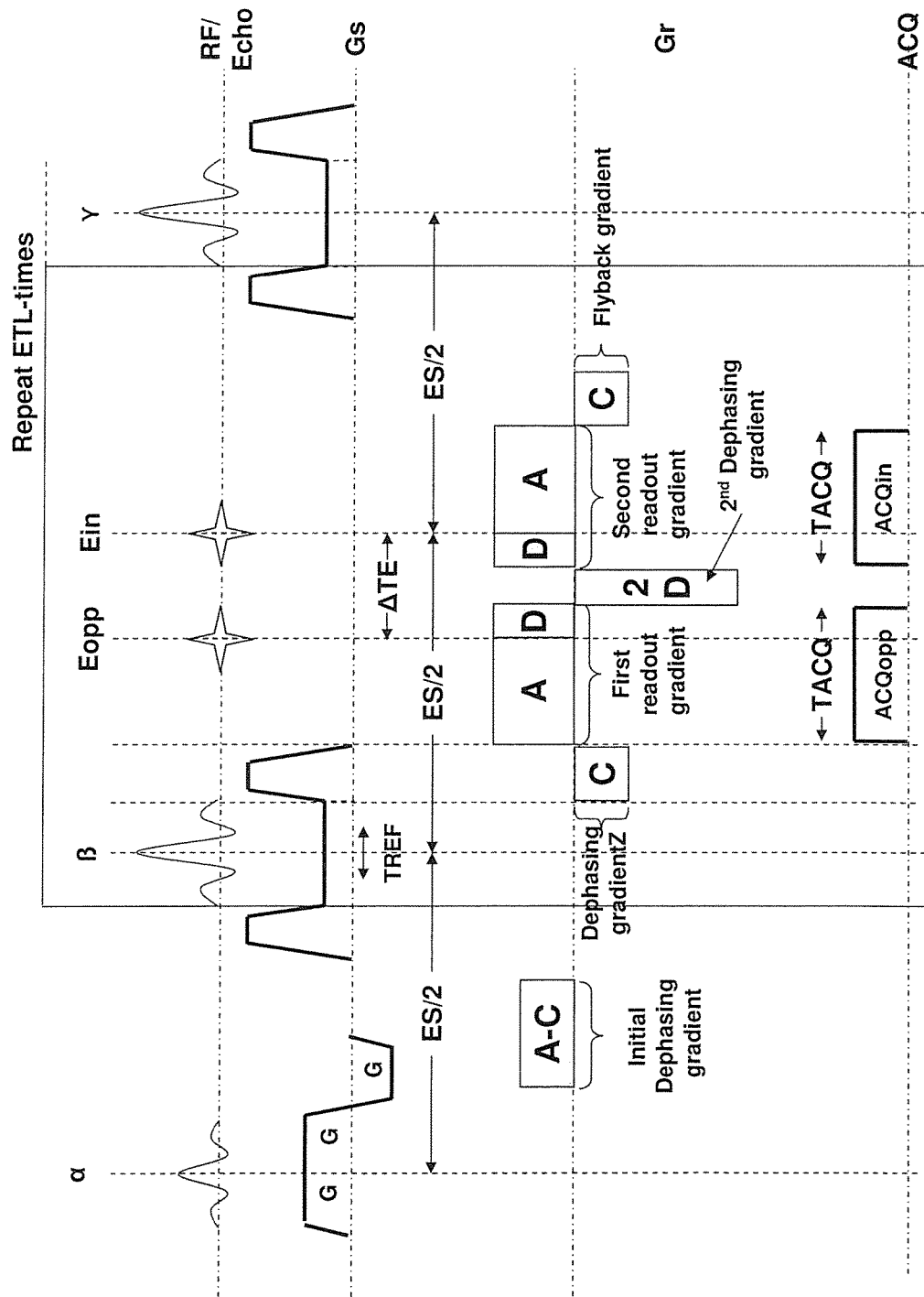
FIG. 6 illustrates a schematic diagram according to a fourth embodiment in the present invention having asymmetric readout.

FIG. 6 illustrates a schematic diagram according to a fourth embodiment in the present invention having asymmetric readout. When both readout gradients have the same sign, the readout gradient waveform is called "monopolar" in this case. The reason for the monopolar design is that the fat-water shift is then in the same direction for both in-phase and opposed-phase image. FIG. 6 shows the sequence diagram with monopolar design. An extra gradient is needed between both gradients that operate as prephasing gradients of the second readout gradient, and it is therefore called second prephasing gradient in FIG. 6. Its moment is chosen such that it exactly compensates the moment acquired by the first readout gradient after the first echo and by the second readout gradient before the second echo. In FIG. 6 again the most general design is shown where the prephasing gradient for the first readout gradient is split into two parts. The first part is executed once between excitation pulse and first refocusing pulse and the second part is repeated for every readout interval. It should be noted that if this second part (with moment C in FIG. 6) is set to zero, no flyback gradient is needed.

Figure 7:
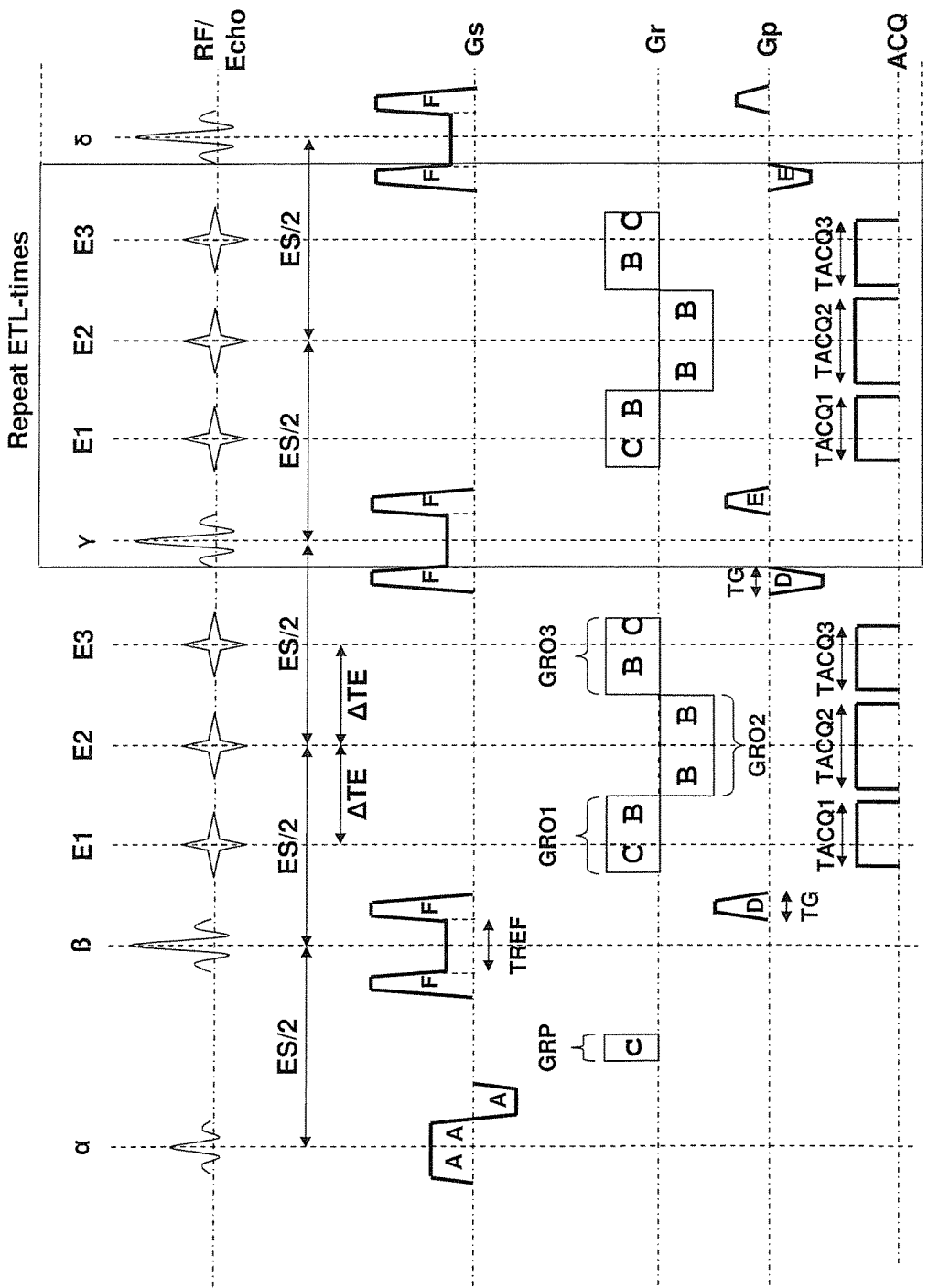
FIG. 7 illustrates a schematic diagram in the present invention having 3-point Dixon sequence with reduced echo spacing.

FIG. 7 illustrates a schematic diagram in the present invention having 3-point Dixon sequence with reduced echo spacing. In TSE imaging the echo spacing is defined as the time between successive refocusing pulses. TSE imaging in general benefits from a short echo spacing. The main reason is that a short echo spacing reduces the T2 decay along the echo train and thereby the so called T2 blurring of the images for a given echo train length (Number of refocusing pulses/readout intervals per excitation pulse). A second reason is that short echo spacing reduces the duration of the entire echo train and therefore increases the efficiency of the sequence, for example, the number of slices that can be acquired in a given TR interval.

The TSE Dixon sequences of the group considered here increase the echo spacing compared to a conventional TSE sequence with a single readout interval per refocusing pulse with the same spatial resolution and readout bandwidth (amplitude and duration of the readout gradient). The increase is at least 2ΔTmax, where ΔTmax is the maximum shift of one of the centers of the readout gradients relative to the spin echo point. Therefore the prolonging of the minimum echo spacing is in particular a problem at low field strength.

As mentioned earlier another objective of the present invention is to provide a CPMG TSE n-point Dixon sequence with shortened echo spacing. FIG. 7 shows an invented 3-point Dixon TSE sequence with reduced echo spacing compared to the three point Dixon state of the art sequence shown in FIG. 1. The temporal position of each gradient echo relative to the spin echo point is chosen to realize a particular desired phase shift between signal emerging from fat and water protons. The invented sequence shortens the duration of the first and/or last readout gradient of each train of readout gradient (relative to duration required for a symmetric readout) by acquiring the first and last echo asymmetrically. The readout prephasing gradient between the excitation pulse and the first refocusing pulse is adapted to maintain the CPMG condition.

Analogous to the sequence shown in FIG. 3, it is also possible to perform the readout prephasing for every readout interval individually. In this case the readout prephasing gradient between excitation pulse and first refocusing pulse is removed. Alternatively, between each refocusing pulse and the first readout gradient of each readout interval, a prephasing gradient with moment −C is inserted and between the last readout gradient of each readout interval and the following refocusing pulse a flyback gradient with moment −C is inserted.

It is also possible to perform part of the readout prephasing between excitation pulse and first refocusing pulse and part of the prephasing individually for each readout interval (in analogy to the sequence shown in FIG. 4).

Figure 8:
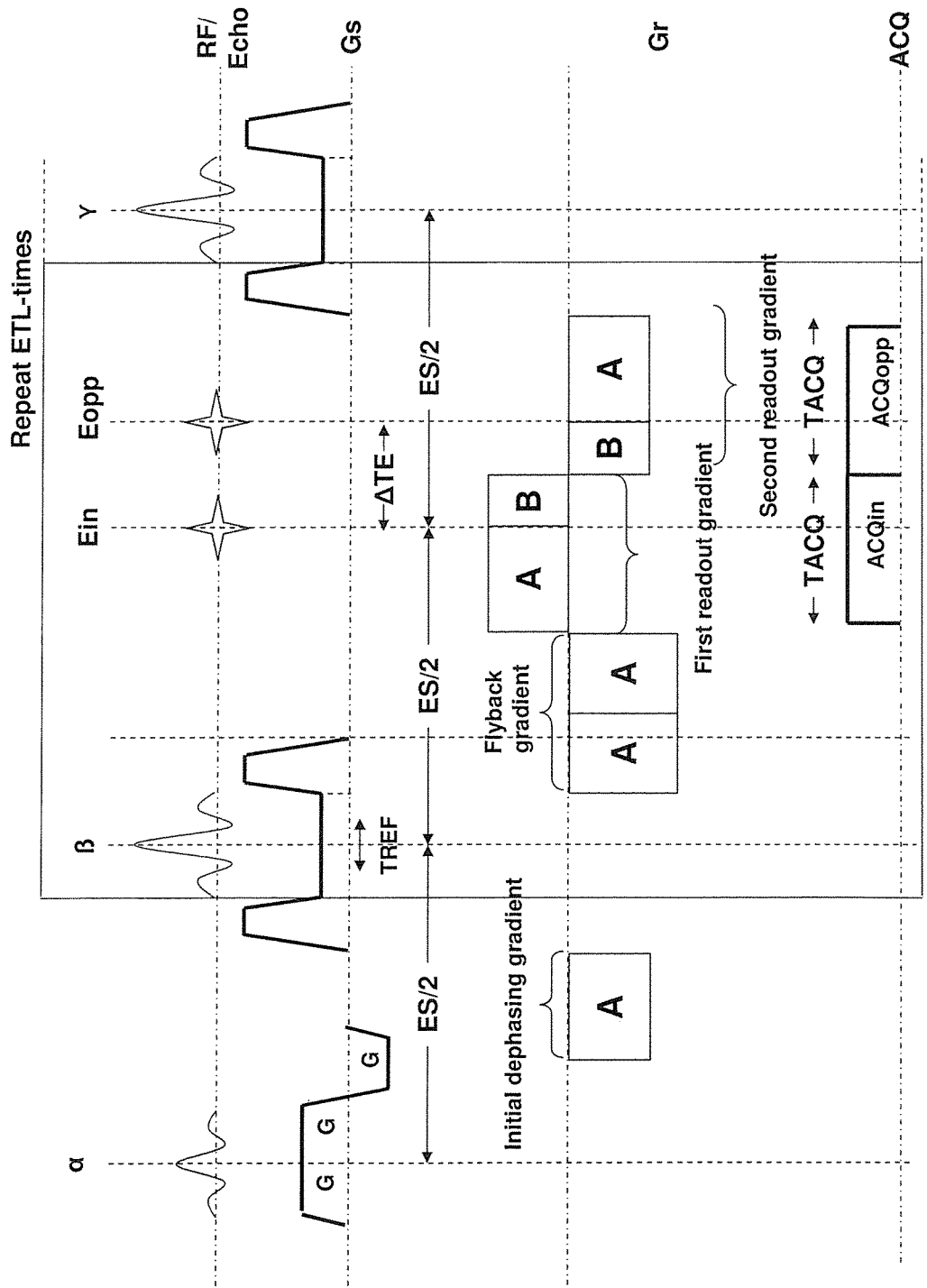
FIG. 8 illustrates a schematic diagram according to a fifth embodiment in the present invention having a sequence with asymmetric readout.

FIG. 8 illustrates a schematic diagram according to a fifth embodiment in the present invention having a sequence with asymmetric readout. FIG. 8 is a variation of FIG. 2 by placing the fly-back gradient in front of the readout gradients. Similar modifications can be made to all other embodiments, if it is, for example, required or preferred to acquire the in-phase phase echo first.

FIG. 9 is a schematic illustration of a magnetic resonance apparatus 23 according to the invention. As it is generally known, it includes a basic field magnet unit 24, which defines a patient receiving area 25, which can be designed with a surrounding radio-frequency (RF) coil arrangement including RF transmitter and RF receiver to transmit and receive RF signals, in particular a body coil 22, and a gradient coil arrangement 28. A patient P or any other object that is to be examined, such as a phantom, can be brought into the magnetic resonance device 23 in the patient receiving area 25, in particular on a patient bed L. For the procedure according to the invention, the object to be examined can be placed into the ISO-center, within the measurement volume M of the magnetic resonance apparatus 23.

Further, the magnetic resonance apparatus 23 can have at least one further radiofrequency coil arrangement, which can be selectively placed at a desired location within the patient receiving area, namely a local coil 27. The local coil 27 can be composed of at least two individual coils with one respective reception channel, for example. The phantom can be measured with the body coil 22 or with the local coil 27, if their sensitivity distribution is known. The operation of the magnetic resonance apparatus 23 is controlled by a control computer 26, which is designed to perform the procedure according to the invention, in particular to operate said gradient coil arrangement to activate said gradients to produce at least two gradient echoes between two successive refocusing pulses among said at least two refocusing pulses, with a temporal distance between said at least two gradient echoes that produces a predetermined phase shift between a signal originating from first nuclei in the subject and a signal originating from second nuclei in the subject, at times of the respective gradient echoes, with readout gradients associated with a first gradient echo, among said at least two gradient echoes, and a last gradient echo, among said at least two gradient echoes, being asymmetrical; and to make the received data signals available in electronic form as a data file at an output of said control computer 26.

The procedure according to the invention is implemented, e.g., by a computer program according to the invention in a control computer 26 of the magnetic resonance apparatus 23, that is executed in the control computer 26. The control computer 26 is thus programmed to perform a procedure according to the invention. For this purpose, an electronically readable data carrier (non-transitory data storage medium) 21, with electronically readable control information stored thereon, which at least includes such a computer program to perform a procedure according to the invention in order to correct artifacts in the described manner, is located in the control unit 26 of a magnetic resonance apparatus 23.

The main advantage of the present invention is the increased maximum spatial resolution in readout direction for a given temporal distance $\Delta T=|T2-T1|$ between the centers of the two readout gradients. In the following this resolution gain is quantified:

It is assumed that the entire readout moment in the symmetric case is 2B (which is limited by the Dixon shift time). The invention adds the moment A−B (A>B) on one side of the readout gradient and thereby increases the readout moment from 2B to A+B. From the resolution point of view the asymmetric readout gradient is equivalent to a symmetric readout gradient with moment 2A since Partial Fourier reconstruction does not change the resolution.

The resolution in MRI is measured in means of the Fourier pixel size $\Delta x$. The Fourier pixel size $\Delta x$ is the field of view (FoV) divided by the number of readout points Nx. Typical numbers in Body imaging are FoV=400 mm and number of readout point Nx=256 or higher.

The smaller the Fourier pixel size the higher the resolution. The Fourier Pixel is inversely proportional to the Readout Moment M0x (assuming a symmetric readout):

$\Delta x = 2\pi/(\gamma M0x) \sim 1/M0x$ wherein $\gamma$ is the gyromagnetic ratio. $\gamma/(2\pi)=42.576$ MHz/T for water protons.

The maximum resolution (minimum pixel size) of the state of the art sequence is therefore proportional to $\Delta x_{sym} \sim \frac{1}{2}B$.

The invention increases the maximum resolution to $\Delta x_{asym} \sim \frac{1}{2}A$.

The relative resolution gain is therefore $\Delta x_{sym}/\Delta x_{asym} = A/B$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data from a subject situated in an MR scanner, comprising:
   a) operating the MR scanner to apply an excitation pulse to the subject,
   b) operating the MR scanner to apply at least two refocusing pulses to the subject,
   c) operating the MR scanner to apply readout gradients in a readout direction to the subject that cause at least two gradient echoes to be formed between two successive refocusing pulses among said at least two refocusing pulses, with a temporal distance between the at least two gradient echoes that produces a predetermined phase shift between a signal being acquired from nuclei of a first in the subject and a signal being acquired from nuclei of a second in the subject at times of the respective gradient echoes, said readout gradients being activated in succession, with each readout gradient being asymmetrical and having an individual polarity, with the respective individual polarities alternating in said succession, and said readout gradients including a readout gradient associated with a first gradient echo, among said at least two gradient echoes, and another readout gradient associated with a last gradient echo, among said at least two gradient echoes; and d) providing the acquired signals to a processor and making the acquired signals available in electronic form from the processor as a data file.

2. A method as claimed in claim 1 comprising operating said MR scanner to make said readout gradients, respectively activated during said gradient echoes, asymmetrical by making a duration of a first part of a readout gradient from a gradient-echo point to an end of that readout gradient, toward the other readout gradient, to be shorter than a duration of a second part of that readout gradient from said gradient-echo point to an opposite end of that readout gradient.

3. A method as claimed in claim 1 comprising, via said control computer, entering said magnetic resonance signals, as k-space data, into a plurality of data entry points in k-space in a memory, and wherein the asymmetry of said readout gradients causes some of said data entry points not to be filled with k-space data, and comprising filling said some of said k-space points not filled with k-space data with zeroes, or with data reconstructed with a partial Fourier reconstruction technique, in order to fill all data entry points in k-space.

4. A method as claimed in claim 1 comprising operating said MR scanner to activate a pre-phasing gradient between said at least two readout gradients, said pre-phasing gradient causing a moment of a readout gradient, after the first gradient echo, that precedes said prephasing gradient, and a moment of a readout gradient, up to a point of said second gradient echo, to be compensated by said pre-phasing gradient.

5. A method as claimed in claim 1 comprising operating said MR scanner to activate a pre-phasing gradient between an excitation pulse and a following refocusing pulse, or between each refocusing pulse and a first readout gradient after that refocusing pulse, to cause the Carr-Purcell-Meiboom-Gill condition to be satisfied.

6. A method as claimed in claim 1 comprising operating said MR scanner to activate a rephasing gradient between a readout gradient and a following refocusing pulse, or between a refocusing pulse and a following readout gradient, that causes the Carr-Purcell-Meiboom-Gill condition to be satisfied.

7. A method as claimed in claim 1 comprising operating said MR scanner to cause an echo spacing between two successive refocusing pulses to be minimized.

8. A method as claimed in claim 1 wherein said first nuclei consist of protons of a first chemical and wherein said second nuclei consist of protons of a second chemical.

9. A magnetic resonance (MR) apparatus, comprising:
an MR scanner comprising a basic field magnet that generates a constant magnetic field, a gradient coil arrangement, and an RF coil arrangement;
a control computer configured to operate the MR scanner to cause the RF coil arrangement to radiate excitation pulses and at least two refocusing pulses into a subject situated in the MR scanner;
said control computer being configured to operate said gradient coil arrangement to apply readout gradients in a readout direction that cause gradient echoes to be produced by nuclei in the subject excited by said excitation pulses;
said control computer being configured to operate said gradient coil arrangement to apply said gradients so as to produce at least two gradient echoes between two successive refocusing pulses among said at least two refocusing pulses, with a temporal distance between said at least two gradient echoes that produces a predetermined phase shift between a signal originating from nuclei of a first type in the subject and a signal originating from nuclei of a second type in the subject, at times of the respective gradient echoes, and so as to activate said readout gradients in succession, with each readout gradient being asymmetrical and having an individual polarity, with the respective individual polarities alternating in said succession, and to include a readout gradient associated with a first gradient echo, among said at least two gradient echoes, and another readout gradient associated with a last gradient echo, among said at least two gradient echoes;
said control computer being configured to operate said MR scanner to receive MR signals from said gradient echoes; and
said control computer being configured to make the received MR signals available in electronic form as a data file at an output of said control computer.

10. The apparatus as claimed in claim 9 wherein said control computer is configured to operate said MR scanner to make said readout gradients, respectively activated during said gradient echoes, asymmetrical by making a duration of a first part of a readout gradient from a gradient-echo point to an end of that readout gradient, toward the other readout gradient, to be shorter than a duration of a second part of that readout gradient from said gradient-echo point to an opposite end of that readout gradient.

11. The apparatus as claimed in claim 9 comprising a memory, and wherein said control computer is configured to enter said magnetic resonance signals, as k-space data, into a plurality of data entry points in k-space in said memory, and wherein the asymmetry of said readout gradients causes some of said data entry points not to be filled with k-space data, and comprising filling said some of said k-space points not filled with k-space data with zeroes, or with data reconstructed with a partial Fourier reconstruction technique, in order to fill all data entry points in k-space.

12. The apparatus as claimed in claim 9 wherein said control computer is configured to operate said MR scanner to activate a pre-phasing gradient between said at least two readout gradients, said pre-phasing gradient causing a moment of a readout gradient, after the first gradient echo, that precedes said prephasing gradient, and a moment of a readout gradient, up to a point of said second gradient echo, to be compensated by said pre-phasing gradient.

13. The apparatus as claimed in claim 9 wherein said control computer is configured to operate said MR scanner to activate a pre-phasing gradient between an excitation pulse and a following refocusing pulse, or between each refocusing pulse and a first readout gradient after that refocusing pulse, to cause the Carr-Purcell-Meiboom-Gill condition to be satisfied.

14. The apparatus as claimed in claim 9 wherein said control computer is configured to operate said MR scanner to activate a rephasing gradient between a readout gradient and a following refocusing pulse, or between a refocusing pulse and a following readout gradient, that causes the Carr-Purcell-Meiboom-Gill condition to be satisfied.

15. The apparatus as claimed in claim 9 wherein said control computer is configured to operate said MR scanner to cause an echo spacing between two successive refocusing pulses to be minimized.

16. The apparatus as claimed in claim 9 wherein said first nuclei consist of protons of a first chemical and wherein said second nuclei consist of protons of a second chemical.

17. A non-transitory, computer-readable data storage medium encoded with programming instructions, said storage medium being loaded into a control computer of a magnetic resonance (MR) apparatus that comprises an MR scanner having a radiofrequency (RF) coil and a gradient coil arrangement, said programming instructions causing said control computer to:

operate the MR scanner to cause the RF coil to radiate excitation pulses and at least two refocusing pulses into a subject situated in the MR scanner;

operate said gradient coil arrangement to apply readout gradients in a readout direction so as to produce at least two gradient echoes between two successive refocusing pulses among said at least two refocusing pulses, with a temporal distance between said at least two gradient echoes that produces a predetermined phase shift between a signal originating from nuclei of a first type in the subject and a signal originating from nuclei of a second type in the subject, at times of the respective gradient echoes, and activate said readout gradients in succession, with each readout gradient being asymmetrical and having an individual polarity, with the respective individual polarities alternating in said succession, and to include a readout gradient associated with a first gradient echo, among said at least two gradient echoes, and another readout gradient associated with a last gradient echo, among said at least two gradient echoes;

operate said MR scanner to receive MR signals from said gradient echoes; and make the received MR signals available in electronic form as a data file at an output of said control computer.

* * * * *